US012744077B2

(12) United States Patent
You et al.

(10) Patent No.: US 12,744,077 B2
(45) **Date of Patent: *Sep. 22, 2026**

(54) MEMORY DEVICE AND METHOD OF CONTROLLING ROW HAMMER

(71) Applicant: SAMSUNG ELECTRONICS CO., LTD., Suwon-si (KR)

(72) Inventors: Jungmin You, Suwon-si (KR); Seongjin Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 207 days.

This patent is subject to a terminal disclaimer.

(21) Appl. No.: 18/669,714

(22) Filed: May 21, 2024

(65) Prior Publication Data

US 2024/0304234 A1 Sep. 12, 2024

Related U.S. Application Data

(63) Continuation of application No. 17/707,034, filed on Mar. 29, 2022, now Pat. No. 12,027,199.

(30) Foreign Application Priority Data

May 26, 2021 (KR) ........................ 10-2021-0067897
Oct. 13, 2021 (KR) ........................ 10-2021-0135933

(51) Int. Cl.
*G11C 11/408* (2006.01)
*G11C 11/406* (2006.01)

(52) U.S. Cl.
CPC ........ *G11C 11/4087* (2013.01); *G11C 11/406* (2013.01)

(58) Field of Classification Search
CPC .......................... G11C 11/4087; G11C 11/406
USPC .................................................... 365/230.06
See application file for complete search history.

(56) References Cited

U.S. PATENT DOCUMENTS

| | | | |
|---|---|---|---|
| 8,938,573 | B2 | 1/2015 | Greenfield et al. |
| 9,431,085 | B2 | 8/2016 | Greenberg et al. |
| 9,747,971 | B2 | 8/2017 | Bains et al. |
| 9,812,185 | B2 | 11/2017 | Fisch et al. |
| 2017/0011792 | A1 | 1/2017 | Oh et al. |
| 2019/0198090 | A1 | 6/2019 | Lee |
| 2019/0347019 | A1 | 11/2019 | Shin et al. |
| 2021/0049269 | A1 | 2/2021 | Ghosh et al. |

(Continued)

FOREIGN PATENT DOCUMENTS

KR 10-2076067 B1 2/2020

OTHER PUBLICATIONS

Notice of Allowance in European Appln. No. 22170235.0, mailed on Oct. 23, 2024, 43 pages.

(Continued)

*Primary Examiner* — Connie C Yoha
(74) *Attorney, Agent, or Firm* — Fish & Richardson P.C.

(57) ABSTRACT

A method of controlling a row hammer swaps a first address entry with a second address entry having the smallest second access number and randomly swaps the first address entry with a third address entry having a third access number which is not the greatest value, in an address table representing a correlation between an address entry accessed during a row hammer monitoring time frame and an access number, thereby preventing a hacker-pattern row hammer aggression from being easily performed.

20 Claims, 11 Drawing Sheets

(56) References Cited

U.S. PATENT DOCUMENTS

| | | | | |
|---|---|---|---|---|
| 2021/0075408 | A1 | 3/2021 | Noguchi | |
| 2021/0151095 | A1 | 5/2021 | Nale et al. | |
| 2022/0067157 | A1 | 3/2022 | Le Rolland et al. | |
| 2022/0293160 | A1 | 9/2022 | Cao | |
| 2023/0178140 | A1* | 6/2023 | Cho | G11C 11/40603 365/222 |

OTHER PUBLICATIONS

European Patent Search Report Dated Oct. 13, 2022 cited in corresponding EP Patent Application No. 22170234.0, 7 pages.
Kim et al., “Flipping Bits in Memory Without Accessing Them: An Experimental Study of DRAM Disturbance Errors,” Carnegie Mellon University, Intel Labs, 2014, pp. 1-12.

* cited by examiner

120
CA
ADDR
CMD
230
ADDRESS BUFFER
220
CONTROL LOGIC CIRCUIT
210
ROW HAMMER CONTROL CIRCUIT
COL_ADDR
ROW_ADDR
RH_ADDR
240
REFRESH CONTROL CIRCUIT
REF_ADDR
ROW DECODER
202
WL
BL
206
COLUMN DECODER
200
MEMORY CELL ARRAY
BANK 4
BANK 3
BANK 2
BANK 1
208
I/O GATING CIRCUIT
260
DATA INPUT BUFFER
270
DATA OUTPUT BUFFER
DQ

312
314
0x02
32
0x06
15
0x0E
9
0x0C
92
0x02
32
0x06
15
0x0E
9
0x0C
92
Tb
Tc
Timeline
Replace
And Increments
Counter Value + 1
Random Select
Except Largest
Counter Value 312
314
0x02
32
0x06
15
0x0E
9
0x0C
92
0x02
32
0x06
9
0x0E
15
0x0C
92
Tc
Td
Timeline
Random Select
Except Largest
Counter Value
Swap Selected
& Replaced

MEMORY DEVICE AND METHOD OF CONTROLLING ROW HAMMER

CROSS-REFERENCE TO RELATED APPLICATIONS

This application is a continuation of U.S. application Ser. No. 17/707,034, filed Mar. 29, 2022, which claims priority under 35 U.S.C. § 119 to Korean Patent Application No. 10-2021-0067897, filed on May 26, 2021, and Korean Patent Application No. 10-2021-0135933, filed on Oct. 13, 2021, in the Korean Intellectual Property Office, the disclosures of which are incorporated by reference herein in their entireties.

BACKGROUND

The disclosure relates to semiconductor memory devices and, more particularly, to a memory device that randomly performs a flattening operation and a random selection operation on row hammer addresses to prevent a hacker-pattern row hammer aggression causing row hammer information to be lost and a method of controlling the memory device.

Dynamic random access memory (DRAM) is a type of random-access semiconductor memory that stores each bit of data in a memory cell. Systems using semiconductor chips use DRAM as main memory or working memory of the system to store data or instructions used by a host and/or to perform computational operations. In general, DRAM writes data or reads data under the control of a host. When a computational operation is performed, a host retrieves instructions and/or data from DRAM, executes the instructions, and/or uses the data to perform the computational operation. When there is a result of the computational operation, the host writes the result to the DRAM.

In order to boost the capacity and the integration of DRAM, a cell size of the DRAM has decreased. Some DRAM-based systems experience intermittent failures occasionally due to a heavy workload. The failures may happen due to repeated accesses to a single memory row, for example, a row hammer event. Data corruption may occur because memory cells adjacent to the repeatedly accessed memory cell rows are disturbed due to the row hammer condition. Memory cells affected by the row hammer condition may be refreshed by a target refresh operation.

In order to manage the row hammer condition, DRAM may monitor hammer addresses intensively accessed among access addresses during a preset time. The DRAM may store hammer addresses in a limited number of registers of an address storage, generate hammer refresh addresses indicating addresses of memory cell rows physically adjacent to memory cell rows corresponding to the hammer addresses, and target-refresh memory cells connected to memory cell rows corresponding to the hammer refresh addresses.

However, an aggressor may use decoy row hammer addresses for the purpose of interfering with a row hammer management operation of the DRAM. As access addresses including the decoy row hammer addresses are newly stored in an address storage, a row hammer address stored in the address storage may be evicted from the address storage and monitored row hammer information may be lost. There is a problem in that the evicted hammer address is vulnerable to a row hammer.

Accordingly, there is a need for a countermeasure against a hacker-pattern row hammer aggression that maliciously evicts a row hammer address from an address storage to cause row hammer information to be lost.

SUMMARY

The disclosure provides a memory device including a control logic circuit for preventing a hacker-pattern row hammer aggression that maliciously evicts an intensively accessed row hammer address from an address storage to cause row hammer information to be lost and a method of operating the memory device.

According to an embodiment, a memory device includes a memory cell array including a plurality of memory cell rows. A control logic circuit is configured to monitor a row address with respect to a memory cell row from among the plurality of memory cell rows during a row hammer monitoring time frame and store the row address as an address entry in an address table in which an access number of the address entry is stored. A refresh control circuit is configured to refresh a memory cell row physically adjacent to another memory cell row corresponding to an address entry having a greatest access number stored in the address table during the row hammer monitoring time frame. The control logic circuit performs a counter-based flattening operation and a random swap operation on the address entry stored in the address table.

According to another embodiment, a control logic circuit includes a logic circuit indicating a correlation between a row address accessed during a row hammer monitoring time frame and an access number. An address table stores a first address entry corresponding to a first row address and a first access number. A first swap circuit is configured to select a second address entry having a second access number, which is the smallest access number in the address table, from the address table and perform a first swap operation of swapping the first address entry with the second address entry. A second swap circuit is configured to select a third address entry having a third access number from the address table and perform a second swap operation related to the first address entry and the third address entry. The third access number is not the greatest value in the address table.

According to another embodiment, a method of operating a memory device, including a plurality of memory cell rows, includes monitoring a first row address with respect to a first memory cell row from among the plurality of memory cell rows during a row hammer monitoring time frame. A first address entry corresponding to the first row address and a first access number is stored in an address table. A second address entry having a second access number, which is the smallest access number in the address table, is selected from the address table. A first swap operation related to the first address entry and the second address entry is performed. A third address entry having a third access number, which does not have the greatest value in the address table, is randomly selected from the address table. A second swap operation related to the first address entry and the third address entry is performed. A memory cell row physically adjacent to another memory cell row corresponding to an address entry having the greatest access number stored in the address table is refreshed during the row hammer monitoring time frame.

BRIEF DESCRIPTION OF THE DRAWINGS

Embodiments of the disclosure will be more clearly understood from the following detailed description taken in conjunction with the accompanying drawings in which:

FIG. 6 is a diagram illustrating a random number generator of the row hammer control circuit of FIG. 3;

FIG. 7 is a flowchart illustrating an operation of a control logic circuit, according to embodiments of the disclosure;

DETAILED DESCRIPTION OF THE EMBODIMENTS

Figure 1:
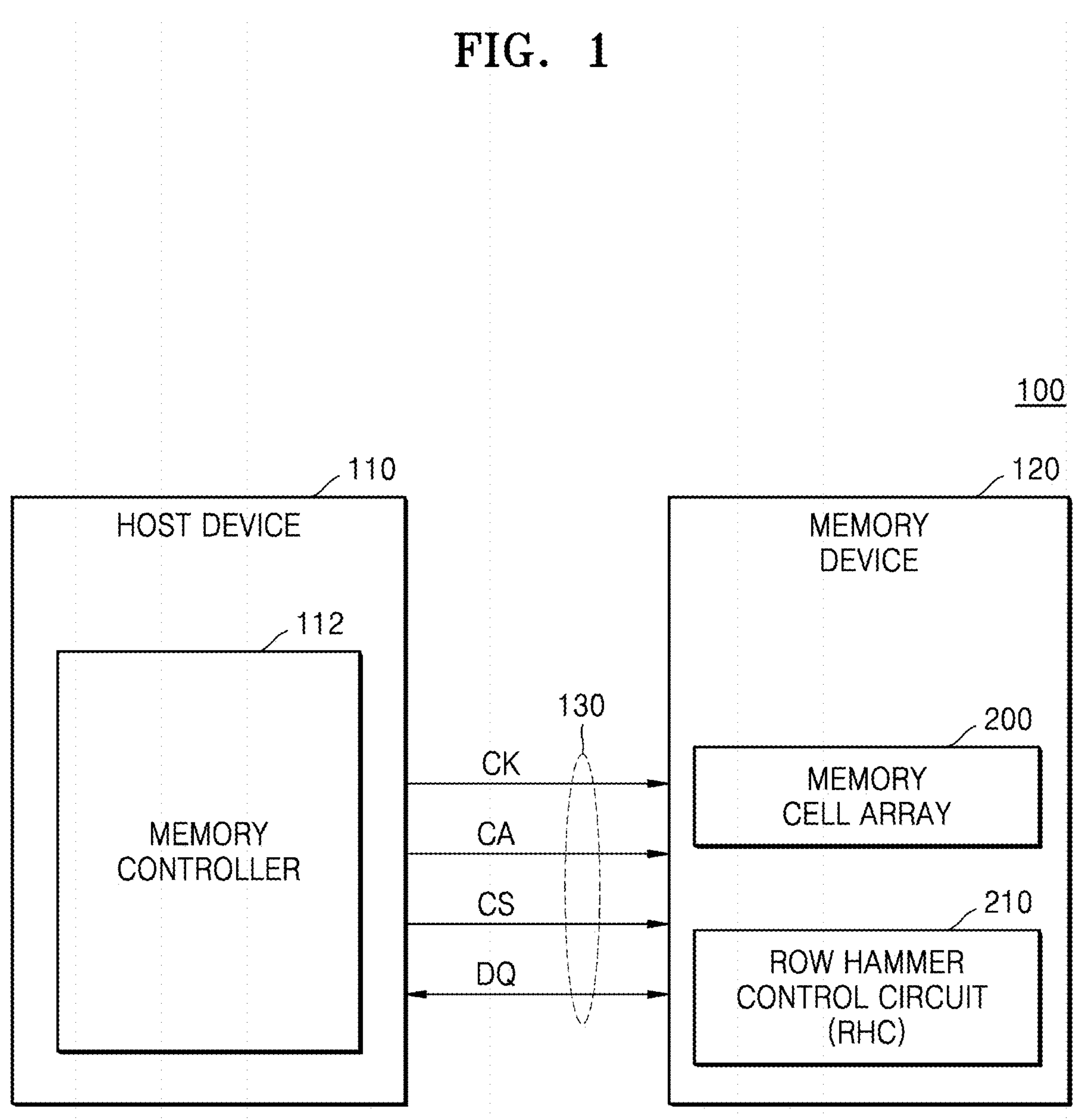
FIG. 1 is a diagram illustrating a system including a memory device for controlling a row hammer, according to example embodiments of the disclosure.

FIG. 1 is a diagram illustrating a system including a memory device for controlling a row hammer, according to example embodiments of the disclosure.

Referring to FIG. 1, a system 100 may include a host device 110 and a memory device 120. The host device 110 may be communicatively connected to the memory device 120 through memory buses 130.

The host device 110 may include, for example, a computing system such as a computer, a notebook computer, a server, a workstation, a portable communication terminal, a personal digital assistant (PDA), a portable multimedia player (PMP), a smartphone, or a wearable device. Alternatively, the host device 110 may include some components included in the computing system, such as a graphics card.

The host device 110 may be a functional block to perform general computational operations in the system 100 and may correspond to a central processing unit (CPU), a digital signal processor (DSP), a graphics processing unit (GPU), or an application processor (AP). The host device 110 may include a memory controller 112 that manages data transmission and reception to and from the memory device 120.

The memory controller 112 may access the memory device 120 according to a memory request of the host device 110. The memory controller 112 may include a memory physical layer interface (memory PHY) for performing interfacing operations with the memory device 120, such as selecting rows and columns corresponding to a memory location, writing data to the memory location, or reading the written data. The memory PHY may include a physical or electrical layer and a logical layer provided for signals, frequencies, timing, driving, detailed operating parameters, and functionality required for efficient communication between the memory controller 112 and the memory device 120. The memory PHY may support the double data rate (DDR) and/or low power double data rate (LPDDR) protocol characteristics according to the joint electron device engineering council (JEDEC) standard.

The memory controller 112 may be connected to the memory device 120 through the memory buses 130. For the brevity of the drawings, a clock signal CK, a command/address signal CA, data DQ, and a chip select signal CS are illustrated to be each provided through one signal line of the memory buses 130 between the memory controller 112 and the memory device 120, but may each be provided actually through a plurality of signal lines or buses. Signal lines between the memory controller 112 and the memory device 120 may be connected to connectors thereof. The connectors may include pins, balls, signal lines, or other hardware components.

The clock signal CK may be transmitted from the memory controller 112 to the memory device 120 through a clock signal line of the memory buses 130. The command/address signal CA may be transmitted from the memory controller 112 to the memory device 120 through a command/address bus among the memory buses 130. The chip select signal CS may be transmitted from the memory controller 112 to the memory device 120 through a chip select line among the memory buses 130. For example, a signal transmitted through the command/address bus when the chip select signal CS is activated to a logic high level may indicate a command signal. The data DQ may be transmitted from the memory controller 112 to the memory device 120 or from the memory device 120 to the memory controller 112 through a data bus of the memory buses 130 composed of bidirectional signal lines.

The memory device 120 may write the data DQ thereto or read the data DQ therefrom and perform a refresh operation under the control by the memory controller 112. For example, the memory device 120 may include a double data rate synchronous dynamic random access memory (DDR SDRAM) device. However, the scope of the disclosure is not limited thereto and the memory device 120 may include any one of volatile memory devices such as LPDDR SDRAM, wide input/output (I/O) dynamic random access memory (DRAM), high bandwidth memory (HBM), and hybrid memory cube (HMC). The memory device 120 may include a memory cell array 200 and a row hammer control circuit 210.

The memory cell array 200 may include a plurality of word lines, a plurality of bit lines, and a plurality of memory cells formed at intersections of the plurality of word lines and the plurality of bit lines. Memory cells of the memory cell array 200 may include volatile memory cells, for example, DRAM cells.

The row hammer control circuit 210 may control a row hammer of a hacker pattern which disturbs row hammer information to be lost from an address table storing at least one row hammer address for the memory cell array 200. The row hammer control circuit 210 may perform a flattening operation and a random selection operation on the row hammer addresses stored in the address table to prevent a row hammer address having a small access number from being evicted from registers. The flattening operation and the random selection operation are randomly performed on the row hammer addresses by the row hammer control circuit 210, and thus, an attacker may not determine how the row hammer is controlled by the memory device 120. Because of randomness of a row hammer control operation, a hacker-pattern row hammer attack may not be easily performed. Accordingly, the row hammer control circuit 210 may prevent row hammer information from being lost and prevent a hacker-pattern row hammer attack from being easily performed.

Figure 2:
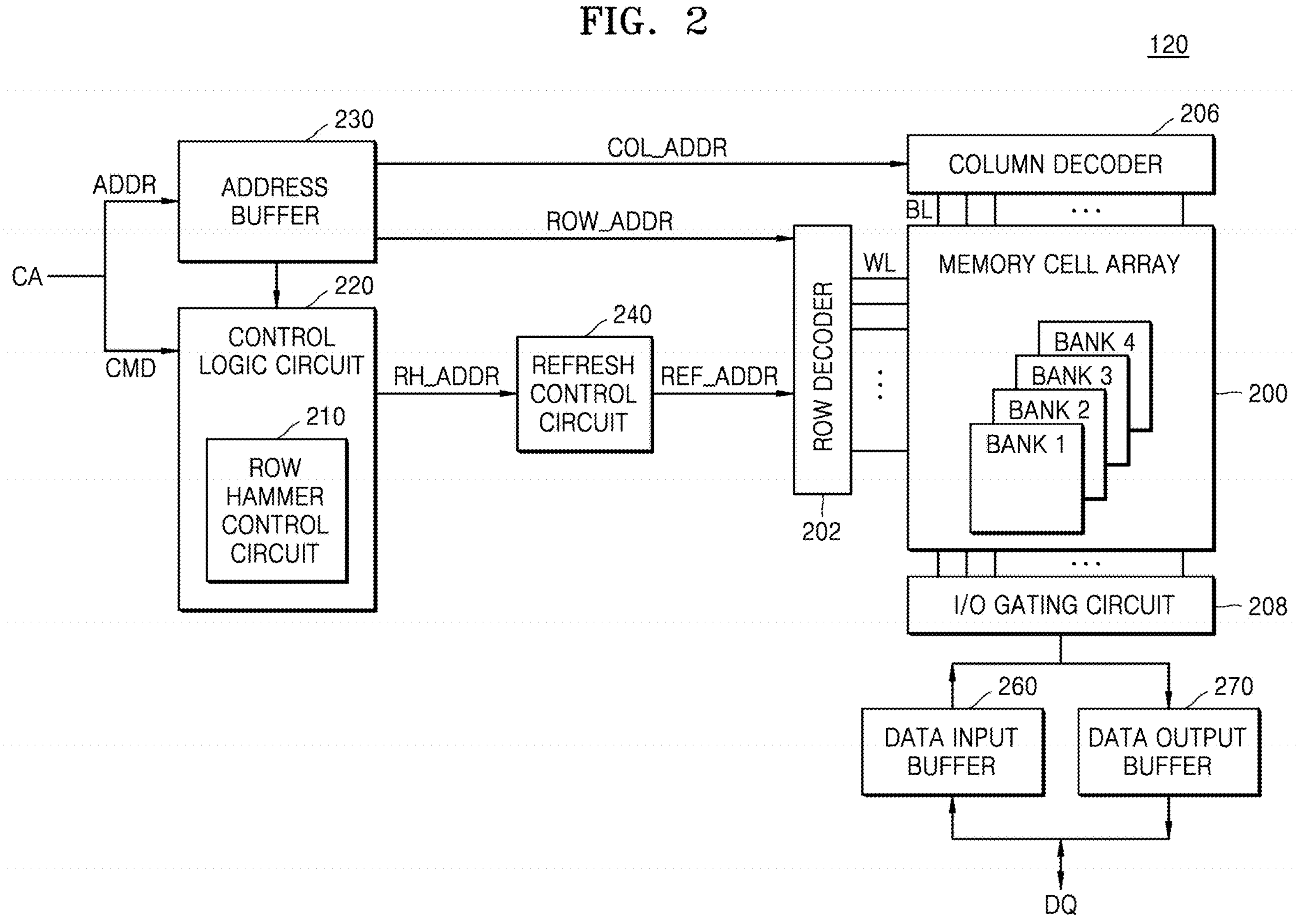
FIG. 2 is a block diagram illustrating a memory device according to example embodiments of the disclosure.

FIG. 2 is a block diagram illustrating a memory device according to embodiments of the disclosure. FIG. 2 illustrates the memory device 120 of FIG. 1 implemented as DRAM. It may be noted that a configuration of the DRAM illustrated in FIG. 2 is an example and is not a configuration of actual DRAM. In addition, the disclosure is not limited by the example configuration of the DRAM illustrated in FIG. 2.

Referring to FIGS. 1 and 2, the memory device 120 may include the memory cell array 200, a row decoder 202, a column decoder 206, an input/output gating circuit 208, a control logic circuit 220, an address buffer 230, a refresh control circuit 240, a data input buffer 260, and a data output buffer 270. Although not illustrated in FIG. 2, the memory device 120 may further include a clock buffer, a mode register set (MRS), a bank control logic, a voltage generation circuit, and so on.

The address buffer 230 may receive an address ADDR including a bank address, a row address ROW_ADDR, and a column address COL_ADDR from the memory controller 112. The address buffer 230 may provide the received bank address to the bank control logic, the received row address ROW_ADDR to the row decoder 202, and the received column address COL_ADDR to the column decoder 206.

The memory cell array 200 may include a plurality of memory cells arranged in rows and columns in a matrix. The memory cell array 200 may include a plurality of word lines WL and a plurality of bit lines BL connected to the plurality of memory cells. The plurality of word lines WL may be connected to rows of the plurality of memory cells, and the plurality of bit lines BL may be connected to columns of the plurality of memory cells. Data of memory cells connected to an activated word line WL may be sensed and amplified by sense amplifiers connected to the plurality of bit lines BL.

The memory cell array 200 may include first to fourth banks BANK1 to BANK4. The bank control logic may generate bank control signals in response to a bank address, and in response to the bank control signals, the row decoder 202 and the column decoder 206 of a bank corresponding to the bank address among the first to fourth banks BANK1 to BANK4 may be activated. Although the present embodiment illustrates an example of the memory device 120 including four banks, the memory device 120 may include any number of banks depending on embodiments.

The row decoder 202 and the column decoder 206 may be arranged to correspond to each of the first to fourth banks BANK1 to BANK4, and the row decoder 202 and the column decoder 206 connected to the bank corresponding to the bank address may be activated. The row decoder 202 may decode the row address ROW_ADDR received from the address buffer 230 to select a word line WL corresponding to the row address ROW_ADDR from among the plurality of word lines WL and may connect the selected word line WL to a word line driver that activates the plurality of word lines WL.

The column decoder 206 may select certain bit lines BL from among the plurality of bit lines BL of the memory cell array 200. The column decoder 206 may decode a burst address gradually increased by +1 based on the column address COL_ADDR in a burst mode to generate a column select signal and may connect the bit lines BL selected by the column select signal to the input/output gating circuit 208. Burst addresses refer to addresses of column locations that may be accessed in terms of a burst length BL for a read and/or write command.

The input/output gating circuit 208 may include read data latches for storing read data of the bit lines BL selected by the column select signal and a write driver for writing write data into the memory cell array 200. Read data stored in the read data latches of the input/output gating circuit 208 may be provided to a data bus through the data output buffer 270 and output as data DQ to the host device 110. Write data output from the host device as data DQ may be written to the memory cell array 200 through the data input buffer 260 connected to the data bus and through a write driver of the input/output gating circuit 208.

The control logic circuit 220 may receive the clock signal CK and the command CMD and generate control signals for controlling an operation timing and/or a memory operation of the memory device 120. The control logic circuit 220 may provide control signals to circuits of the memory device 120 to operate as set in operations and control parameters stored by the MRS. The control logic circuit 220 may read data from and write data to the memory cell array 200 by using the control signals. Although the control logic circuit 220 and the address buffer 230 are illustrated as separate components in FIG. 2, the control logic circuit 220 and the address buffer 230 may be implemented as one inseparable component. In addition, although the command CMD and the address ADDR are illustrated as separate signals in FIG. 2, the address may be regarded as included in the command as suggested in the LPDDR standard or so on.

The control logic circuit 220 may be configured to detect a row hammer address that is intensively accessed during a row hammer monitoring time frame and perform a target-refresh operation of a memory cell row physically adjacent to a memory cell row corresponding to the row hammer address. The control logic circuit 220 may store access addresses in the address table and may perform a flattening operation and a random selection operation on an address entry stored in the address table.

The control logic circuit 220 may randomly perform a flattening operation and a random selection operation on the address entry of the address table to prevent an address entry having a small access number from being evicted from the address table. The control logic circuit 220 may prevent a hacker-pattern row hammer aggression, in which a hacker attempts to maliciously evict a row hammer address from an address storage, from being easily performed due to randomness of a flattening operation and a random selection operation performed on the address entry during each row hammer monitoring time frame.

The control logic circuit 220 may include a row hammer control circuit 210 for controlling a decoy row hammer of a hacker pattern during a row hammer monitoring time frame. The row hammer control circuit 210 is described below with reference to FIG. 3. In the following embodiments, it is described that the row hammer control circuit 210 controls a decoy row hammer of a hacker pattern, but embodiments of the disclosure are not limited thereto. For example, the row hammer control circuit 210 may be described as corresponding to a configuration provided in the control logic circuit 220 and the control logic circuit 220 may be described as controlling a decoy row hammer of a hacker pattern.

The control logic circuit 220 may control, in response to the refresh command CMD, the refresh control circuit 240 to perform a normal refresh operation by increasing a refresh counter value by +1. In addition, the control logic circuit 220 may control the refresh control circuit 240 to perform a target row refresh operation based on a row hammer address RH_ADDR. The refresh control circuit 240 may generate a refresh address REF_ADDR corresponding to a memory cell row on which a normal refresh operation and/or a target row refresh operation is to be performed.

Figure 3:
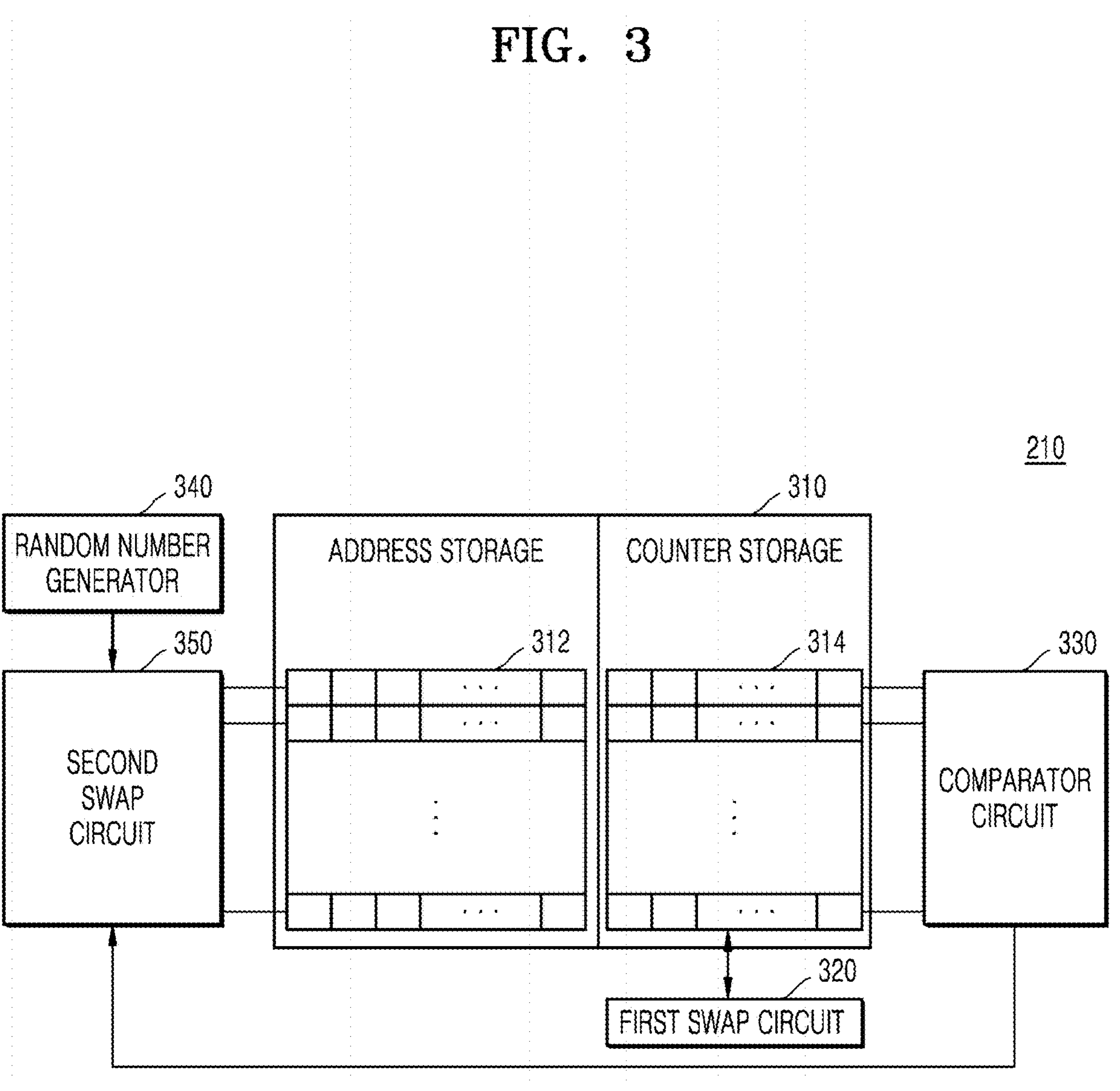
FIG. 3 is a block diagram illustrating a row hammer control circuit according to embodiments of the disclosure.
Figure 4:
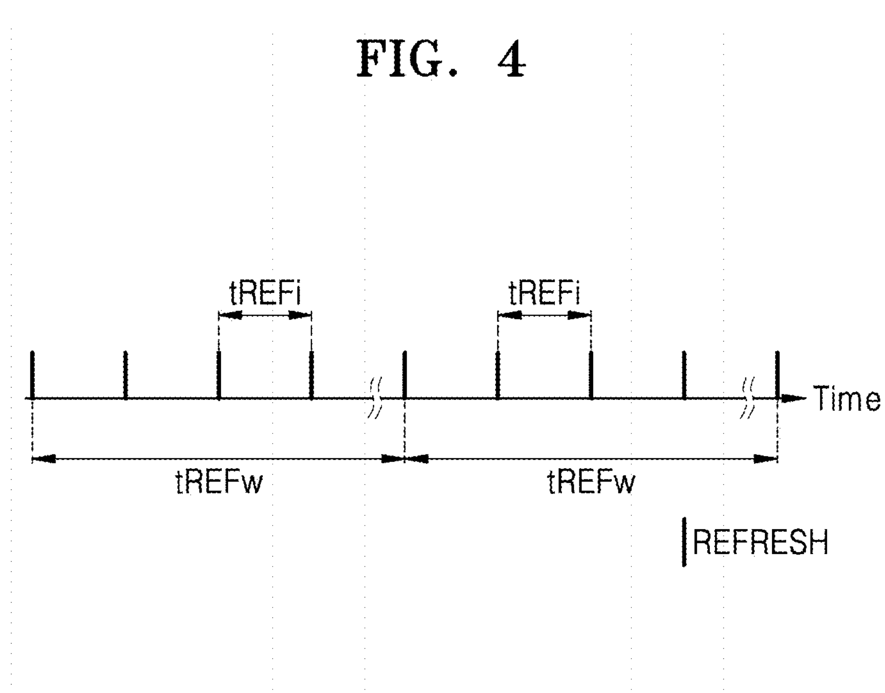
FIG. 4 is a diagram illustrating a refresh operation of the memory device of FIG. 2.
Figure 5:
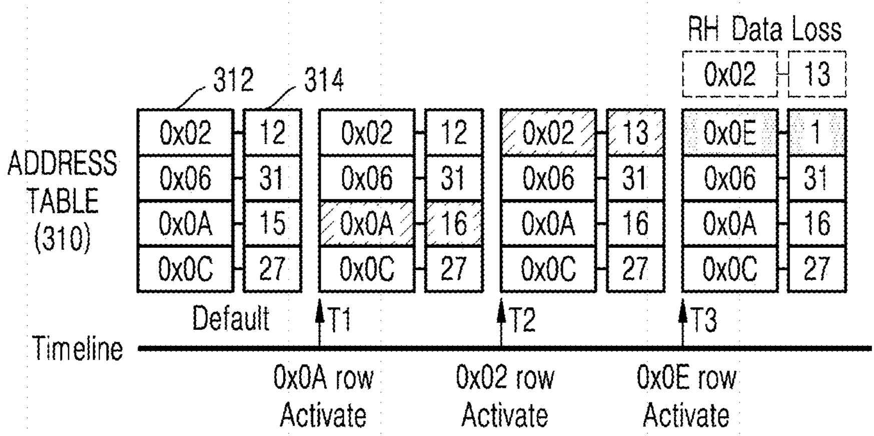
FIG. 5 is a diagram illustrating an example in which an address table of FIG. 3 is reconfigured.
Figure 6:
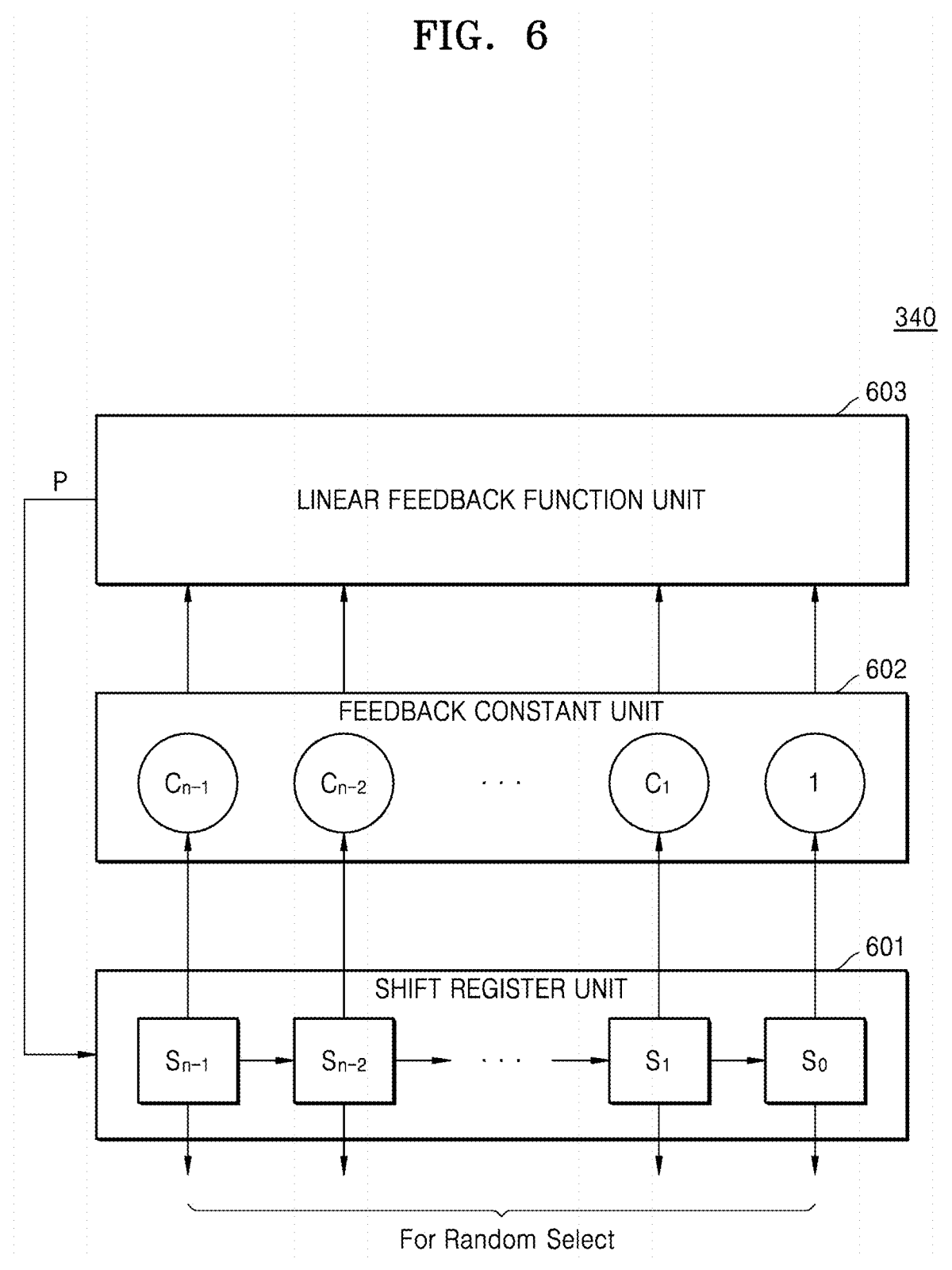

FIG. 3 is a block diagram illustrating a row hammer control circuit according to embodiments of the disclosure. FIG. 4 is a diagram illustrating a refresh operation of the memory device of FIG. 2. FIG. 5 is a conceptual diagram illustrating an example in which an address table of FIG. 3 is reconfigured. FIG. 6 is a diagram illustrating a random number generator of the row hammer control circuit of FIG. 3. Hereinafter, the row hammer control circuit collectively refers to the circuits implemented in hardware, firmware, software, or a combination thereof for controlling or managing a row hammer.

Referring to FIGS. 2 and 3, the row hammer control circuit 210 may be configured to monitor a row hammer on one or more memory cell rows in the memory cell array 200 and to detect a row hammer of a certain memory cell row. The certain memory cell row refers to a memory cell row having the greatest access number or the greatest number of active commands during a preset time period. As illustrated in FIG. 4, the preset time period may be set to about 32 ms or about 64 ms of the refresh window time tREFw defined in the JEDEC standard. According to an embodiment, the preset time period may be set as a basic refresh rate time tREFi of FIG. 4. A basic refresh rate is defined as the number of refresh commands REFRESH of about 8K in a 32 ms refresh window. Hereinafter, the preset time period may be referred to as a row hammer monitoring time frame or a time window set by the control logic circuit 220.

The row hammer control circuit 210 may detect a row hammer address that is intensively accessed during a row hammer monitoring time frame and prevent a decoy row hammer of a hacker pattern. The row hammer control circuit 210 may include an address table 310, a first swap circuit 320, a comparison circuit 330, a random number generator 340, and a second swap circuit 350. The address table 310 may include registers allocated to an address storage 312 and a counter storage 314.

As illustrated in FIG. 5, the address storage 312 and the counter storage 314 of the address table 310 may store access addresses for activating memory cell rows of the memory cell array 200 and access numbers. The address table 310 illustrated as an example in FIG. 5 includes four registers and may be reconfigured according to points in time T1 to T3.

It is assumed that, in FIG. 5, a 0x02 address entry having an access number of 12, a 0x06 address entry having an access number of 31, a 0x0A address entry having an access number of 15, and a 0x0C address entry having an access number of 27 are stored in advance in the address storage 312 and the counter storage 314 of the address table 310 in a default state.

When an access address corresponding to the 0x0A memory cell row is applied at time T1, the access number of the 0x0A address entry stored in the address storage 312 is incremented by 1, and thus, the access number may be increased from 15 to 16. When an access address corresponding to the 0x02 memory cell row is applied at time T2, the access number of the 0x02 address entry stored in the address storage 312 is incremented by 1, and thus, the access number may be increased from 12 to 13. Thereafter, at time T3, an access address corresponding to the 0x0E memory cell row may be applied. A new 0x0E address entry may be stored in the address table 310, and there is no free space because the address table 310 is full. Accordingly, the 0x02 address entry having the smallest access number of 13 may be evicted, and the 0x0E address entry may be stored with the access number of 1 in the free space. The 0x02 address entry to be evicted is an address having the smallest access in the address table 310, but as the 0x02 address entry is evicted from the address table 310, row hammer data on the 0x02 address may be lost.

In this way, an aggressor may use a decoy entry stored in the address table 310 for the purpose of causing the row hammer address to be evicted from the address table 310. In order to prevent a pattern of a hacker pattern such as a decoy entry, the row hammer control circuit 210 may randomly perform a flattening operation and a random selection operation on the address entries stored in the address table 310.

In FIG. 3, the row hammer control circuit 210 may receive an access address for activating a memory cell row of the memory cell array 200 and store a first address entry having a first access number (for example, 1) in a free space of the address table 310. When there is no free space in the address table 310, the first swap circuit 320 may select a second address entry having a second access number from the address table 310 and perform a first swap operation of swapping the first address entry with the second address entry. The second access number may be set as the smallest access number among the access numbers stored in the address table 310.

When swapping the first address entry with the second address entry, the first swap circuit 320 may set the access number of the first address entry to a first value increased by 1 from the second access number. Accordingly, the access number of the first address entry may be changed from the first access number to the second access number+1. A first swap operation performed in this way may be referred to as a counter-based flattening operation.

The comparison circuit 330 may randomly select a third address entry having a third access number from the address table 310. The third access number may be set to an access number that is not the greatest value among the access numbers stored in the address table 310.

The random number generator 340 may be configured to randomly select one of the addresses of the access numbers that are not the greatest value selected by the comparison circuit 330. The random number generator 340 may generate random numbers by using an algorithm used to generate the random numbers. For example, the random number generator 340 may generate random numbers according to a linear congruential random number generation algorithm, a middle-square random number generation algorithm, a Mersenne Twister random number generation algorithm, and so on and output the random numbers. In addition, the random number generator 340 may have a hardware logic for generating the random numbers.

For example, the random number generator 340 may be configured as a linear feedback shift register (LFSR) that generates and outputs a linear random number sequence based on a primitive polynomial. The LFSR may include a shift register unit 601, a feedback constant unit 602, and a linear feedback function unit 603, as illustrated in FIG. 6.

Referring to FIG. 6, the shift register unit 601 may include n shift registers $S_0$, $S_1$, . . . , $S_{n-1}$, the shift registers $S_0$, $S_1$, . . . , $S_{n-1}$ may receive and shift an output P of the linear feedback function unit 603, and the shift registers $S_0$, $S_1$, . . . , $S_{n-1}$ may respectively transmit outputs thereof to stages of the feedback constant unit 602 one-to-one.

The feedback constant unit 602 takes values of modes 0 and 1 as coefficients of a primitive polynomial and outputs values of $C_i$ ($C_0$=1, I=1, 2, . . . ) indicating a connection state to the shift register unit 601. The feedback constant unit 602 may receive the bits $s_0$, $s_1$, . . . , $s_{n-1}$ output from of the shift register unit 601 and transmit the outputs and constant values $C_i$ ($C_0$=1, I=1, 2, . . . ) thereof to the linear feedback function unit 603.

The linear feedback function unit 603 may receive bits $s_0$, $s_1$, . . . , $s_{n-1}$ output from the feedback constant unit 602, generate the output P according to Equation 1, and transmit the output P to the shift register unit 601.

$$P = s_0 + C_1 s_1 + \ldots + C_{n-1} s_{n-1} \quad \text{Equation 1}$$

An operation process of a linear feedback shift register (LFSR) is as follows. The linear feedback function unit 603 may calculate and output the output P. Thereafter, the shift register unit 601 outputs all of bits $s_0$, $s_1$, . . . , $s_{n-1}$ and receives and shifts the output P of the linear feedback function unit 603. The shift registers $S_0$, $S_1$, . . . , $S_{n-1}$ output the bits $s_0$, $s_1$, . . . , $s_{n-1}$ to the feedback constant unit 602. All of the bits $s_0$, $s_1$, . . . , $s_{n-1}$ output from the shift register unit 601 whenever the operation process is repeated may be output as random values. Based on the random value output from the shift register unit 601, the comparison circuit 330 may randomly select an address entry having a third access number that is not the greatest value from the address table 310.

Referring back to FIG. 3, the second swap circuit 350 may perform a second swap operation related to the third address entry, having the third access number randomly selected from the address table 310 by the comparison circuit 330 and the random number generator 340, and the first address entry. The second swap operation may be a random swap operation in which the second access number+1 of the first address entry is swapped with the third access number. According to an embodiment, the second swap operation may be a random swap operation in which the first address entry is swapped with the third address entry.

Figure 7:
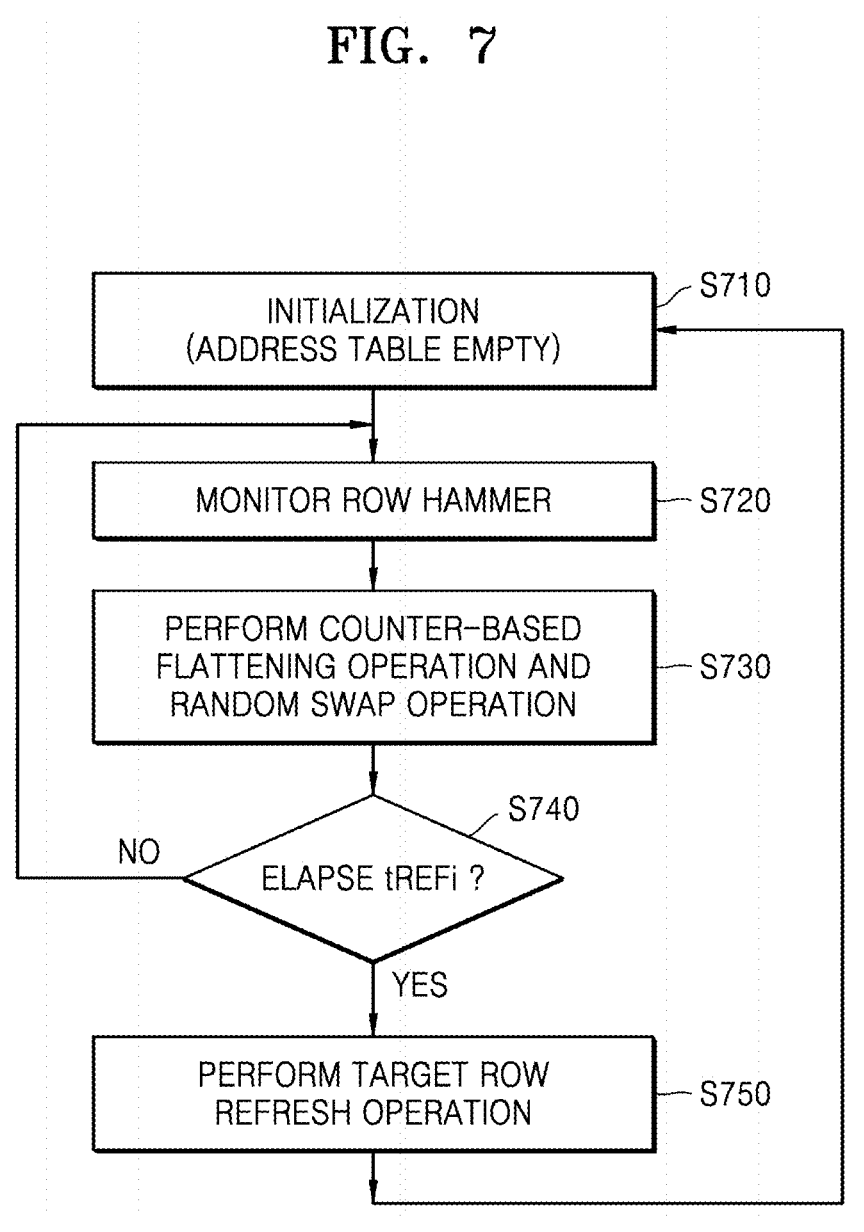

FIG. 7 is a flowchart illustrating an operation of a control logic circuit according to embodiments of the disclosure.

Referring to FIG. 7 in conjunction with FIGS. 1 to 6, the system 100 may perform initialization in operation S710. When the system 100 is powered up, the memory controller 112 and the memory device 120 may perform an initial setting operation according to a preset method. Default operation parameters may be set in initialization of the memory device 120. For example, the row hammer monitoring time frame tREFi may be set. In addition, the address table 310 may be reset to be emptied every row hammer monitoring time frame tREFi.

In operation S720, the control logic circuit 220 may perform an operation of monitoring a row hammer. In the operation of monitoring the row hammer (operation S720), the control logic circuit 220 may count access numbers of the addresses to be accessed during the row hammer monitoring time frame tREFi and store the access addresses and the access numbers in the address table 310.

In operation S730, the control logic circuit 220 may perform a counter-based flattening operation and a random swap operation on the access address entries obtained in operation S720 and stored in the address table 310. The flattening operation and random swap operation S730 will be described in detail with reference to FIG. 8.

In operation S740, the control logic circuit 220 may determine whether the row hammer monitoring time frame tREFi elapses. When the row hammer monitoring time frame tREFi has not elapsed (NO), the processing may proceed to operation S720. The control logic circuit 220 may repeat a row hammer monitoring operation on the access addresses in operation S720. Otherwise, when the row hammer monitoring time frame tREFi has elapsed (YES), the processing may proceed to operation S750.

In operation S750, the control logic circuit 220 may perform a target row refresh operation based on an address entry having the greatest access number among the access numbers of the address entries stored in the address table 310. The control logic circuit 220 may provide the address entry having the greatest access number as a row hammer address RH_ADDR to the refresh control circuit 240. The refresh control circuit 240 may generate a hammer refresh address indicating an address of a memory cell row physically adjacent to a memory cell row corresponding to the row hammer address RH_ADDR and target-refresh memory cells connected to a memory cell row corresponding to the hammer refresh address. After the target row refresh operation of operation S750 is performed, the processing proceeds to operation S710, and thus, address entries and access numbers in the address table 310 may be emptied.

Figure 8:
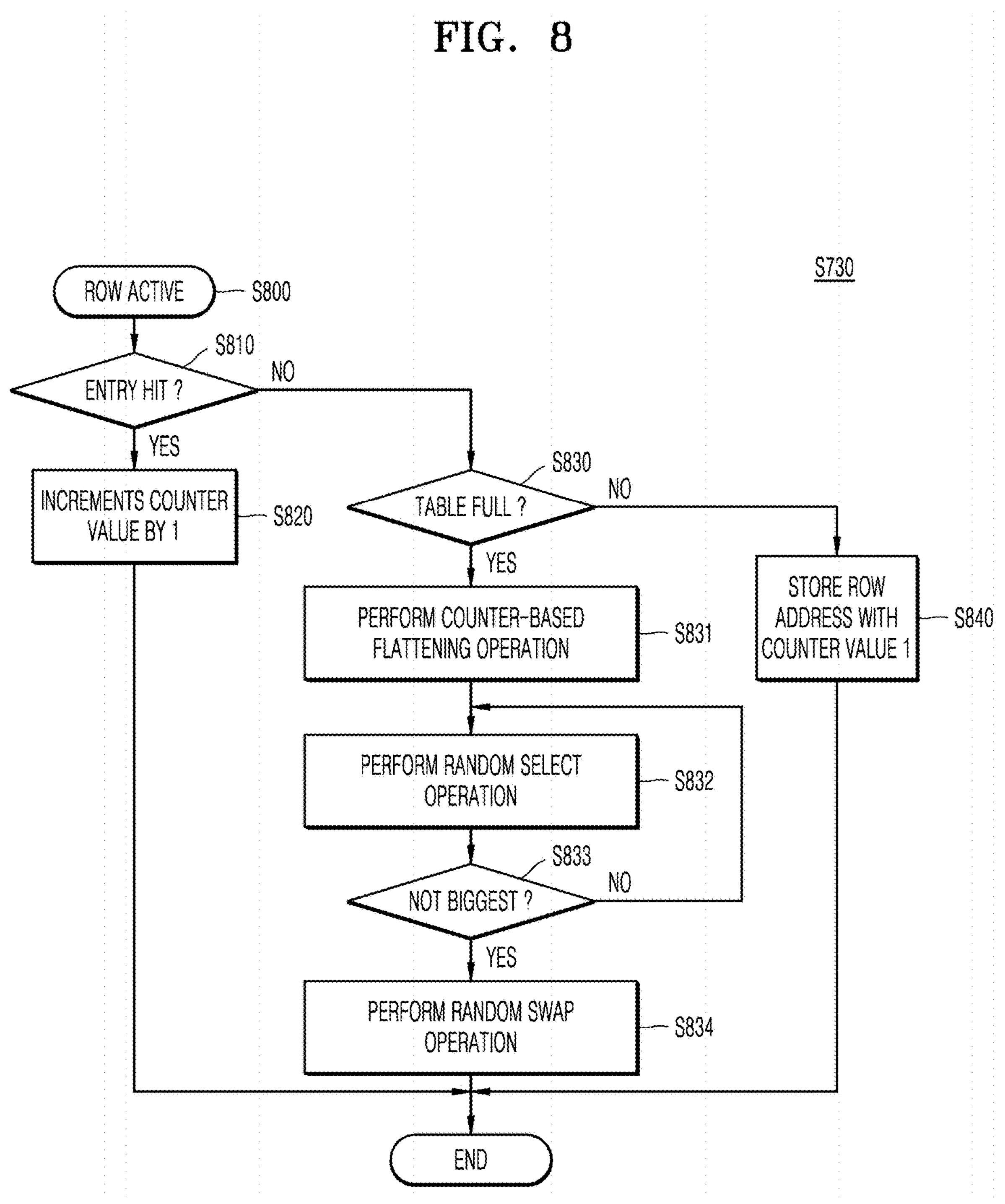
FIG. 8 is a flowchart illustrating an operation of a control logic circuit, according to embodiments of the disclosure.
Figure 9:
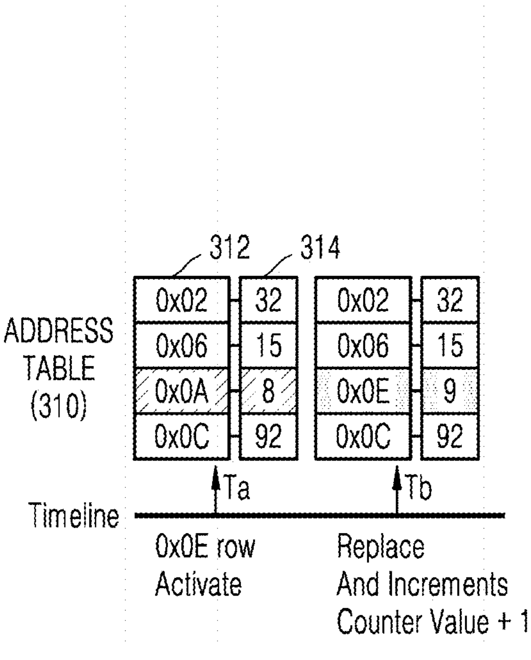
FIGS. 9 to 11 are diagrams illustrating address tables that are reconfigured for each point in time Ta to Td according to the operation of FIG. 8.
Figures 10, 11:
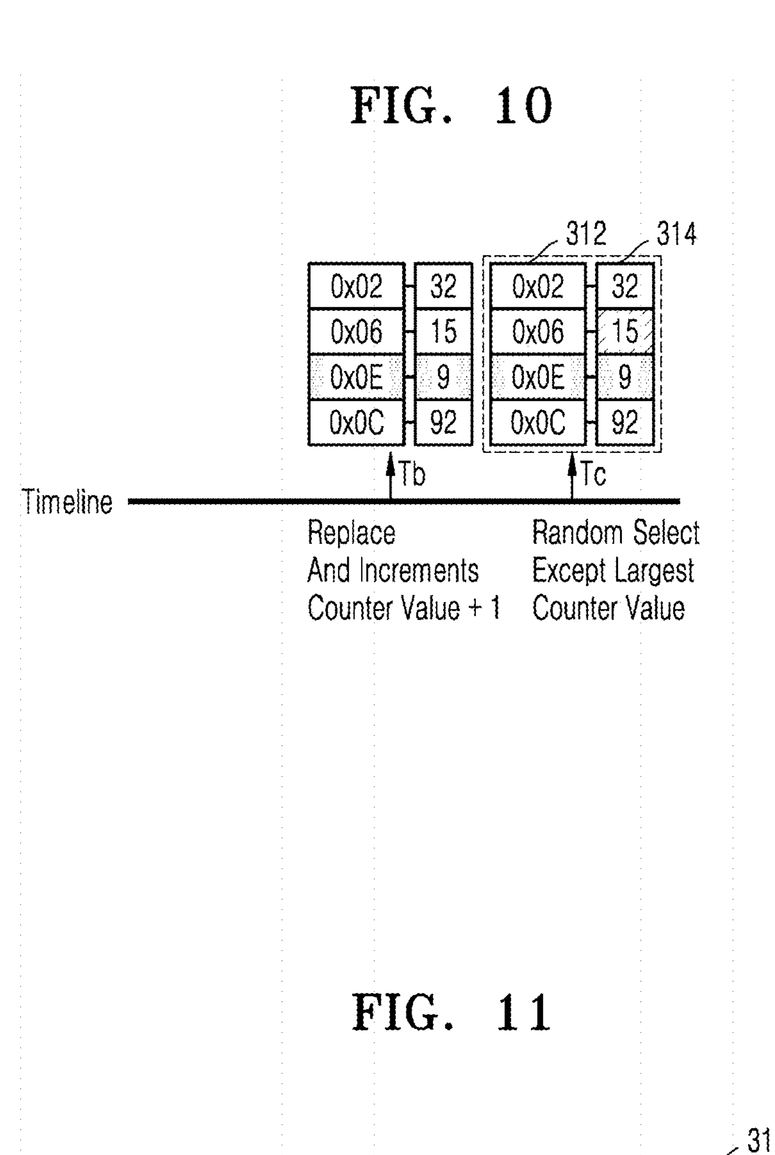

FIG. 8 is a flowchart illustrating an operation of a control logic circuit according to embodiments of the disclosure. FIG. 8 is a flowchart specifically explaining the counter-based flattening operation and random swap operation S730 described with reference to FIG. 7. FIGS. 9 to 11 are diagrams illustrating the address table 310 reconfigured at each point in time Ta to Td according to the operation flows of FIG. 8.

First, the control logic circuit 220 may store the access address entries and the access numbers in the address table 310 according to the row hammer monitoring operation (operation S720) described with reference to FIG. 7. It is assumed that the address storage 312 and the counter storage 314 in the address table 310 are composed of four registers as illustrated in FIG. 9. For example, it is assumed that a 0x02 address entry having an access number of 32, a 0x06 address entry having an access number of 15, a 0x0A address entry having an access number of 8, and a 0x0C address entry having an access number of 92 are stored in advance in the address storage 312 and the counter storage 314 in the address table 310 of FIG. 9.

Referring to FIG. 8 in conjunction with FIGS. 1 to 7, the control logic circuit 220 may receive a first row address together with a row active command in operation S800. In operation S810, the control logic circuit 220 may determine whether the received first row address matches an address entry stored in the address table 310. As a result of the determination, when the received first row address matches the address entry (YES), the processing may proceed to operation S820, and when the received first row address does not match the address entry (NO), the processing may proceed to operation S830. In operation S820, the control logic circuit 220 may increment a counter value of the matched address entry by 1.

In operation S830, the control logic circuit 220 may determine whether there is no free space because the address entries of the address table 310 are full. As a result of the determination, when there is a free space (NO), the processing may proceed to operation S840, and when there is no free space, the processing may proceed to operation S831. In operation S840, the control logic circuit 220 may store the first row address entry in a free space of the address table 310.

In operation S831, the control logic circuit 220 may perform a counter-based flattening operation on the address entries of the address table 310. The control logic circuit 220 may select an address entry having the smallest access number from among the address entries stored in the address table 310. The control logic circuit 220 may swap the address entry having the smallest access number with the first row address entry by using the first swap circuit 320.

Operation S831 may be performed at points in time Ta and Tb of FIG. 9. At the point in time Ta, a 0x0E address entry may be accessed. When the received 0x0E address entry does not match an address entry stored in the address table 310 (operation S810) and there is no free space in the address table 310 (operation S830), the control logic circuit 220 may select the 0x0A address entry having the smallest access number of 8. The first swap circuit 320 may swap the selected 0x0A address entry with the 0x0E address entry. The 0x0E address entry may be replaced with the 0x0A address entry to be stored in the address table 310. In this case, the first swap circuit 320 may store an access number of the 0x0E address entry obtained by incrementing the access number of 8 of the swapped 0x0A address entry by a first value (for example, 1). For example, the access number of the 0x0E address entry may be stored as 9.

In operation S832, the control logic circuit 220 may perform a random selection operation on the address entries of the address table 310. The control logic circuit 220 may randomly select any one of the address entries of the address table 310 by using the random number generator 340.

In operation S833, the control logic circuit 220 may determine whether an access number of the address entry selected by the random selection operation in operation S832 is not the greatest value by using the comparison circuit 330. As a result of the determination, when the access number is the greatest value (NO), the processing may proceed to operation S832 and when the access number is not the greatest value (YES), the processing may proceed to operation S834. Operation S832 and operation S833 may be repeated until an address entry having an access number other than the greatest value is selected.

Operation S832 and operation S833 may be performed at a point in time Tc of FIG. 10. At the point in time Tc, the comparison circuit 330 may select one of access numbers of 32 and 15 other than an access number of 92 that is the greatest value from the address table 310. For example, an access number of 15 may be selected by the comparison circuit 330.

In operation S834, the control logic circuit 220 may perform a random swap operation on the address entries of the address table 310. The control logic circuit 220 may swap the access number that is not the greatest value selected by the comparison circuit 330 with the access number of the first row address entry by using the second swap circuit 350.

Operation S834 may be performed at a point in time Td of FIG. 11. At the point in time Td, the second swap circuit 350 may swap the access number of 15 that is not the greatest access number selected in operation S832 and operation S833 with the access number of 9 of the 0x0E address entry. Accordingly, the access number of the 0x0E address entry may be changed from 9 to 15, and the access number of the 0x06 address entry may be changed from 15 to 9. According to an embodiment, the 0x0E address entry may be swapped with the 0x06 address entry instead of solely being incremented by a number of accesses.

An aggressor may not determine that the flattening operation and random swap operation S730 are randomly performed in this way on address entries stored in the address table 310. In addition, a decoy row hammer aggression of a hacker pattern may not be easily performed due to randomness of the flattening operation and random swap operation S730 during each row hammer monitoring time frame. Accordingly, the control logic circuit 220 may prevent row hammer information from being lost and prevent a hacker-pattern row hammer aggression from being easily performed.

Figure 12:
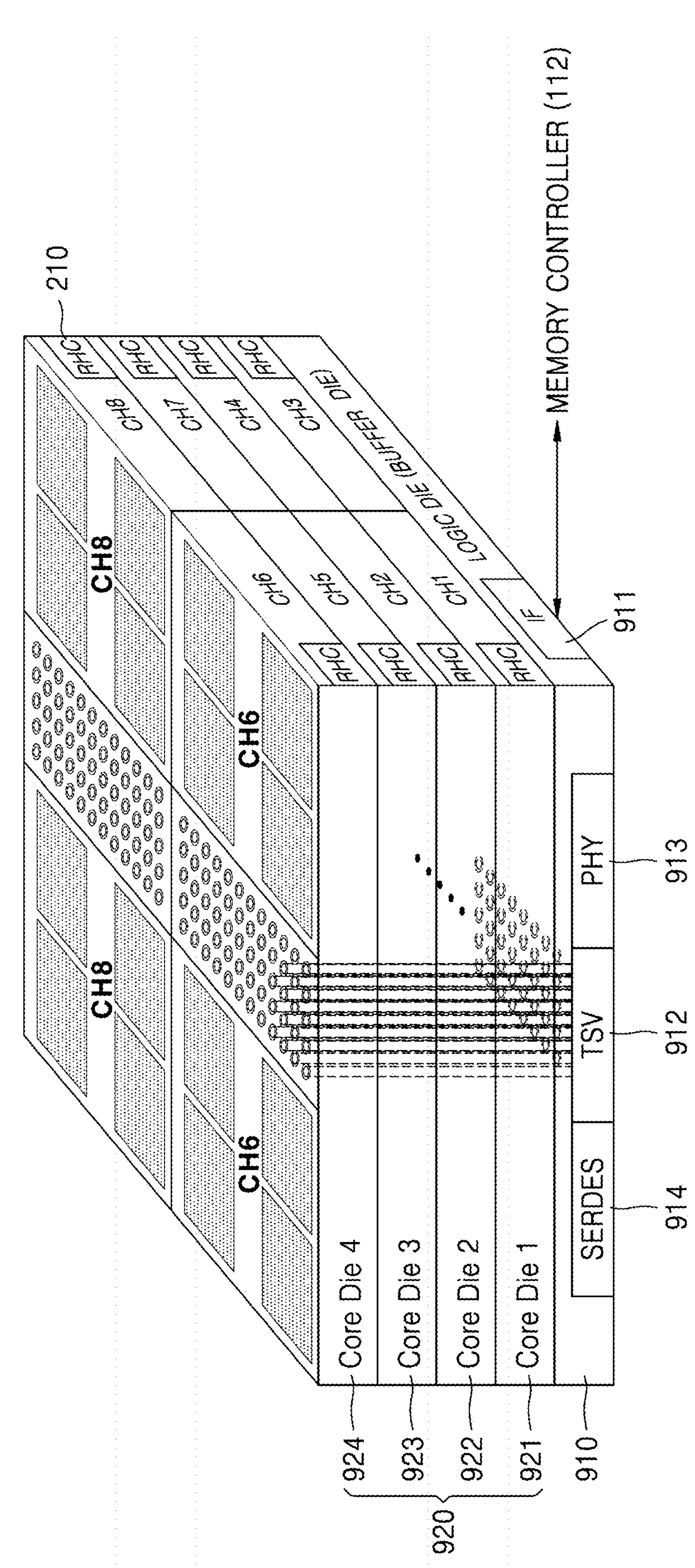
FIG. 12 is a view illustrating a memory device for controlling a row hammer according to an example embodiment of the disclosure.

FIG. 12 is a view illustrating a memory device for controlling a row hammer according to an example embodiment of the disclosure. FIG. 12 illustrates the memory device 120 of FIG. 1 implemented in HBM. It may be noted that an HBM configuration illustrated in FIG. 12 is provided as an example and is not an actual HBM configuration. In addition, the disclosure is not limited by an example of the HBM configuration illustrated in FIG. 12. Hereinafter, subscripts (for example, a of 120*a*) attached to the same reference numerals in different drawings are used to distinguish a plurality of circuits having similar or identical functions. For the sake of convenient description, a memory device 120*a* may be hereinafter referred to as an HBM.

Referring to FIGS. 1 and 12, the HBM 120*a* may be connected to the host device 110 through an HBM protocol of the JEDEC standard. The HBM protocol is a high-performance random access memory (RAM) interface for three-dimensional stacked memories (for example, DRAM). The HBM 120*a* generally achieves a wider bandwidth while consuming less power in a substantially smaller form factor than other DRAM technologies (for example, DDR4, graphics DDR5 (GDDR5), and so on).

The HBM 120*a* may have a high bandwidth by including a plurality of channels CH1 to CH8 having interfaces independent of each other. The HBM 120*a* may include a plurality of dies, for example, a logic die 910 (910 (or a buffer die)) and one or more core dies 920 stacked on the logic die 910. FIG. 12 illustrates an example in which first to fourth core dies 921 to 924 are provided in the HBM 120*a*, but the number of core dies 920 may be variously changed. The core dies 920 may be referred to as memory dies.

Each of the first to fourth core dies 921 to 924 may include one or more channels. FIG. 12 illustrates an example in which each of the first to fourth core dies 921 to 924 includes two channels and the HBM 120*a* includes eight channels CH1 to CH8. For example, the first core die 921 may include a first channel CH1 and a third channel CH3, the second core die 922 may include a second channel CH2 and a fourth channel CH4, the third core die 923 may include a fifth channel CH5 and a seventh channel CH7, and the fourth core die 924 may include a sixth channel CH6 and an eighth channel CH8.

The logic die 910 may include an interface circuit 911 communicating with the host device 110 and receive a command/address signal and data from the host device 110 through the interface circuit 911. The host device 110 may transmit the command/address signal and the data through the buses 130 corresponding to the first channel CH1 to the eighth channel CH8, and the buses 130 may be formed to be divided for each channel or some of the buses 130 may be shared by at least two channels. The interface circuit 911 may transmit the command/address signal and the data to channels through which the host device 110 requests a memory operation or arithmetic processing. In addition, according to an example embodiment of the disclosure, each of the core dies 920 or each of the channels may include a processor-in-memory (PIM) circuit.

The host device 110 may provide the command/address signal and the data such that at least some of a plurality of arithmetic operations or kernels may be performed by the HBM 120*a*, and a PIM circuit of a channel designated by the host device 110 may perform arithmetic processing. For example, when the received command/address signal indicates arithmetic processing, the PIM circuit of a corresponding channel may perform the arithmetic processing by using write data provided from the host device 110 and/or data read from the corresponding channel. In another example, when the command/address signal received through a corresponding channel of the HBM 120*a* indicates a memory operation, an access operation on data may be performed.

According to an embodiment, each of the first to eighth channels CH1 to CH8 may include a plurality of banks and one or more processing elements may be provided in a PIM circuit in each of the first to eighth channels CH1 to CH8. For example, the number of processing elements in each channel may be equal to the number of banks or one processing element may be shared among at least two banks when the number of processing elements is less than the number of banks. The PIM circuit in each of the first to eight channels CH1 to CH8 may perform a kernel offloaded by the host device 110.

According to an embodiment, each of the first to eighth channels CH1 to CH8 may include the row hammer control circuit 210 described with reference to FIGS. 1 to 11. Each of the first to eighth channels CH1 to CH8 may include a logic circuit representing a correlation between a row address accessed during the row hammer monitoring time frame tREFi and an access number, and the logic circuit may include an address table in which a first address entry and a first access number corresponding to a first row address are stored. Each of the first to eighth channels CH1 to CH8 may perform a flattening operation and a random selection operation by which the first address entry is swapped with a second address entry having a smallest second access number in the address table and may randomly perform a random swap operation of swapping the first address entry with a third address entry having a third access number that is not the greatest value in the address table. Accordingly, each of the first to eighth channels CH1 to CH8 may prevent an address entry having a small access number from being evicted from registers and may prevent a hacker-pattern row hammer aggression from being easily performed.

In addition, the logic die 910 may further include a through silicon via (TSV) region 912, an HBM physical layer interface (HBM PHY) region 913, and a serializer/deserializer (SERDES) region 914. The TSV region 912 is a region in which a TSV for communication with the core dies 920 is formed and is a region in which the buses 130 corresponding to the first to eighth channels CH1 to CH8 are formed. When each of the first to eight channels CH1 to CH8 has a bandwidth of 128 bits, the TSVs may include configurations for data input/output of 1024 bits.

The HBM PHY region 913 may include a plurality of input/output circuits for communication with the memory controller 112 and the first to eight channels CH1 to CH8, and for example, the HBM PHY region 913 may include one or more interconnect circuits for connecting the first to eighth channels CH1 to CH8 to the memory controller 112. The HBM PHY region 913 may include a physical or electrical layer and a logical layer provided for signals, frequencies, timing, driving, detailed operating parameters, and functionality required for efficient communication between the memory controller 112 and the first to eighth channels CH1 to CH8. The HBM PHY region 913 may perform memory interfacing such as selecting a row and a column corresponding to a memory cell for a corresponding channel, writing data into the memory cell, or reading the written data from the memory cell. The HBM PHY region 913 may support features of an HBM protocol of a JEDEC standard.

The SERDES region 914 is a region for providing a SERDES interface of the JEDEC standard as processing throughput of a processor of the host device 110 increases and as requirements for a memory bandwidth increase. The SERDES region 914 may include a SERDES transmitter, a SERDES receiver, and a controller. The SERDES transmitter may include a parallel-to-serial circuit and a transmitter, receive a parallel data stream, and serialize the received parallel data stream. The SERDES receiver may include a reception amplifier, an equalizer, a clock and data recovery circuit, and a serial-to-parallel circuit to receive a serial data stream and parallelize the received serial data stream. The controller may include an error detection circuit, an error correction circuit, and registers such as first in first out (FIFO).

Figure 13:
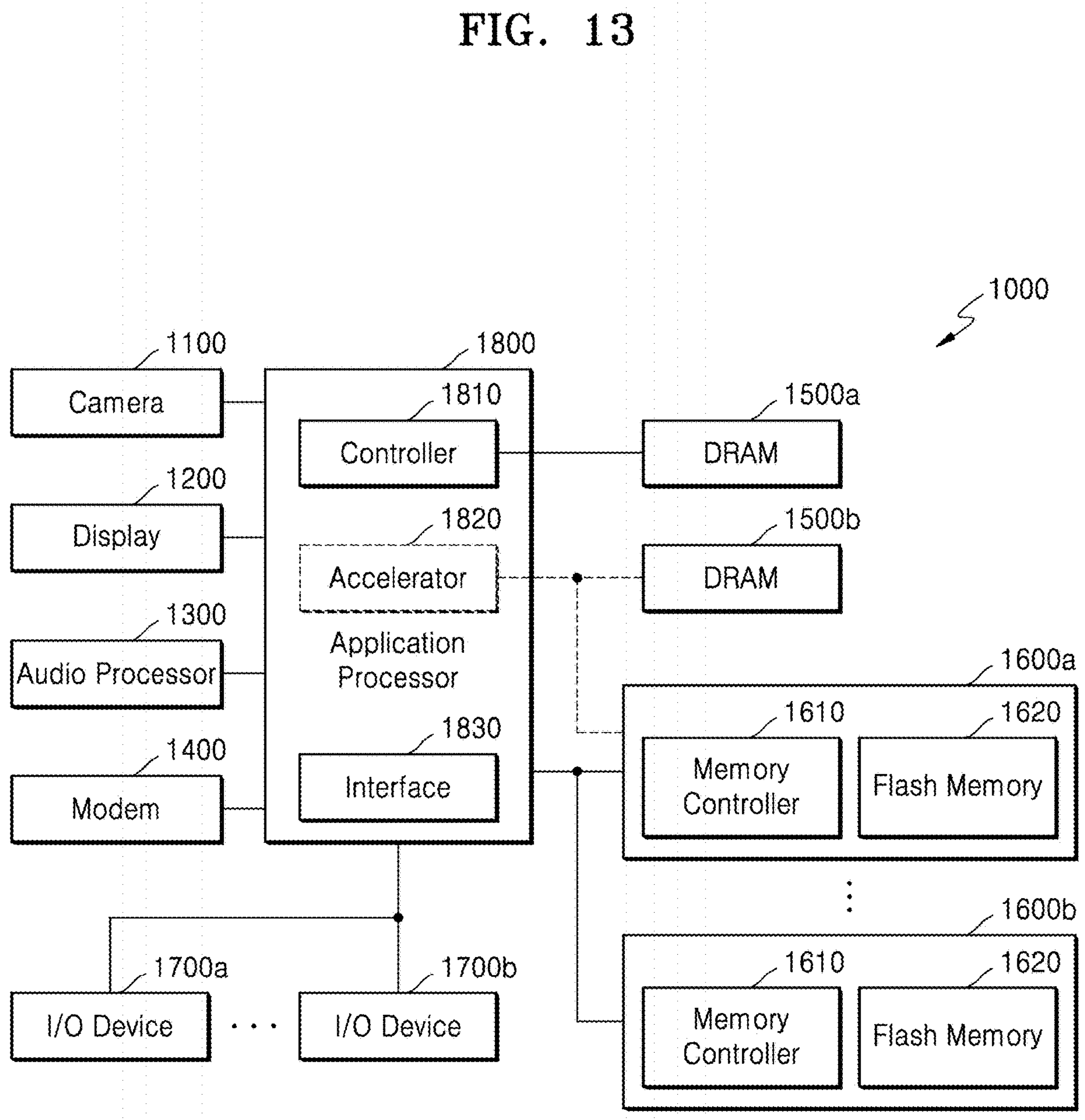
FIG. 13 is a block diagram illustrating a system including a memory device for controlling a row hammer, according to example embodiments of the disclosure.

FIG. 13 is a block diagram illustrating a system including a memory device for controlling a row hammer, according to embodiments of the disclosure.

Referring to FIG. 13, a system 1000 may include a camera 1100, a display 1200, an audio processor 1300, a modem 1400, DRAMs 1500*a* and 1500*b*, flash memories 1600*a* and 1600*b*, I/O devices 1700*a* and 1700*b*, and an application processor (AP) 1800. The system 1000 may implemented as a laptop computer, a mobile phone, a smartphone, a tablet personal computer (PC), a wearable device, a healthcare device, or an internet of things (IOT) device. In addition, the system 1000 may be implemented as a server or a PC.

The camera 1100 may capture a still image or a moving image according to a user's control and may store the captured images or image data therein or transmit the captured images or image data to the display 1200. The audio processor 1300 may process audio data included in content of the flash memories 1600*a* and 1600*b* or a network. The modem 1400 may modulate a signal and transmit the modulated signal through wired/wireless communication, and a receiver may receive and demodulate the modulated signal to obtain an original signal. The I/O devices 1700*a* and 1700*b* may include devices having a digital input function and/or a digital output function, such as a Universal Serial Bus (USB) or storage, a digital camera, a secure digital (SD) card, a digital versatile disc (DVD), a network adapter, and a touch screen.

The AP 1800 may entirely control an operation of the system 1000 using a controller 1810 and interface 1830. The AP 1800 may control the display 1200 such that some of contents stored in the flash memories 1600*a* and 1600*b* is displayed on the display 1200. When a user input is received through the I/O devices 1700*a* and 1700*b*, the AP 1800 may perform a control operation corresponding to the user input. The AP 1800 may include an accelerator block, which is a dedicated circuit for artificial intelligence (AI) data arithmetic, or may include an accelerator 1820 separate from the AP 1800. The DRAM 1500*b* may be additionally mounted in the accelerator block or the accelerator 1820. The accelerator 1820 may include a function block that performs a certain function of the AP 1800, and the accelerator 1820 may include a GPU that is a function block for processing graphics data, a neural processing unit (NPU) that is a block for performing AI calculation and inference, and a data processing unit (DPU) that is a block for transmitting data.

The system 1000 may include the plurality of DRAMs 1500*a* and 1500*b*. The AP 1800 may control the DRAMs 1500*a* and 1500*b* through command and mode register (MRS) settings conforming to the JEDEC standard or may set a DRAM interface protocol for communication to use company-specific functions such as a low voltage, a high speed, and reliability and a cyclic redundancy Check (CRC)/error correction code (ECC) function. For example, the AP 1800 may communicate with the DRAM 1500*a* through an interface which conforms to the JEDEC standard, such as LPDDR4 or LPDDR5, and the accelerator block or the accelerator 1820 may set a new DRAM interface protocol for communication to control the DRAM 1500*b* for the accelerator 1820 having a higher bandwidth than the DRAM 1500*a*.

Only the DRAMs 1500*a* and 1500*b* are illustrated in FIG. 13 but are not limited thereto, and any type of memory, such as phase-change random access memory (PRAM), static random access memory (SRAM), magnetic random access memory (MRAM), resistive random access memory (RRAM), ferroelectrics random access memory (FRAM), or Hybrid random access memory may be used when satisfying a bandwidth, a response speed, and a voltage condition of the AP 1800 or the accelerator 1820. The DRAMs 1500*a* and 1500*b* have relatively less latency and a relatively smaller bandwidth than the I/O devices 1700*a* and 1700*b* or the flash memories 1600*a* and 1600*b*. The DRAMs 1500*a* and 1500*b* may be initialized when the system 1000 is powered on, used as temporary storages for an operating system and application data when the operating system and the application data are loaded, or used as execution spaces for various software code.

The DRAMs 1500*a* and 1500*b* may perform addition/subtraction/multiplication/division operations, a vector operation, address arithmetic, or fast Fourier transform (FFT) arithmetic. In addition, the DRAMs 1500*a* and 1500*b* may perform a function used for inference. Here, the inference may be performed by a deep learning algorithm using an artificial neural network. The deep learning algorithm may include a training operation of learning a model through various data and an inference operation of recognizing data by using the learned model. In an embodiment, an image captured by a user through the camera 1100 is signal-processed and stored in the DRAM 1500*b* and the accelerator block or the accelerator 1820 may perform AI data arithmetic that recognizes data by using a function used for the data stored in the DRAM 1500*b* and the inference.

The system 1000 may include a plurality of storages or a plurality of flash memories 1600*a* and 1600*b* having greater capacity than the capacity of the DRAMs 1500*a* and 1500*b*. The accelerator block or the accelerator 1820 may perform the training operation and the AI data arithmetic by using the flash memory devices 1600*a* and 1600*b*. In an embodiment, the flash memories 1600*a* and 1600*b* may perform more efficiently the training operation and the inference AI data arithmetic performed by the AP 1800 and/or the accelerator 1820 by using a computing device included in the memory controller 1610. The flash memories 1600*a* and 1600*b* may store pictures taken by the camera 1100 or data transmitted through a data network. For example, the flash memories 1600*a* and 1600*b* may store augmented reality/virtual reality, and high definition (HD) or ultra-high definition (UHD) content. Each of flash memories 1600*a* and 1600*b* may store information in a flash memory device 1620.

The DRAMs 1500*a* and 1500*b* in the system 1000 may include the row hammer control circuit described with reference to FIGS. 1 to 11. The DRAMs 1500*a* and 1500*b* may include a logic circuit representing a correlation between a row address accessed during the row hammer monitoring time frame tREFi and an access number, and the logic circuit may include an address table in which a first address entry corresponding to a first row address and a first access number are stored. The DRAMs 1500*a* and 1500*b* may perform a flattening operation and a random selection operation of swapping the first address entry with a second address entry having the lowest second access number in an address table and may randomly perform a random swap operation of swapping the first address entry with a third address entry having a third access number that is not the greatest value in the address table. Accordingly, the DRAMs 1500*a* and 1500*b* may prevent an address entry having a small access number from being evicted from registers and prevent a hacker-pattern row hammer aggression from being easily performed.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been particularly shown and described with reference to embodiments thereof, it will be understood that various changes in form and details may be made therein without departing from the spirit and scope of the following claims.

What is claimed is:

1. A method of operating a memory device including a plurality of memory cell rows, the method comprising:

monitoring a first row address, corresponding to a first address entry, with respect to a first memory cell row from among the plurality of memory cell rows during a row hammer monitoring time frame;

selecting a second address entry having a second access number, which is the smallest access number in an address table, from the address table based on there being no free space in the address table;

performing a first swap operation related to the first address entry and the second address entry;

randomly selecting a third address entry having a third access number, which does not have the greatest value in the address table, from the address table;

performing a second swap operation related to the first address entry and the third address entry; and refreshing a memory cell row physically adjacent to another memory cell row corresponding to an address entry having the greatest access number stored in the address table during the row hammer monitoring time frame.

2. The method of claim 1, further comprising performing a flattening operation by setting an access number of the first address entry to a first value obtained by incrementing the second access number by 1.

3. The method of claim 2, wherein the performing of the second swap operation related to the first address entry and the third address entry comprises performing a random swap operation of swapping the access number of the first address entry, the access number of the first address entry having the first value, with the third access number.

4. The method of claim 2, wherein the performing of the second swap operation related to the first address entry and the third address entry comprises performing a random swap operation of swapping the first address entry with the third address entry.

5. The method of claim 1, wherein the performing of the second swap operation related to the first address entry and the third address entry comprises randomly selecting the third address entry from the address table by using a random number generator.

6. The method of claim 1, further comprising resetting the address table to a free space after the row hammer monitoring time frame elapses.

7. The method of claim 1, wherein the row hammer monitoring time frame is set to a basic refresh rate time defined in the memory device.

8. A method of operating a memory device, the method comprising:

identifying within an address access table, which associates a count of accesses to each of multiple memory addresses, a first count of accesses to a first memory address that is neither the highest nor the lowest count of accesses within the address access table;

swapping the first count of accesses with the lowest count of accesses within the address access table, wherein the lowest count of accesses is a count of access to a second memory address within the address access table; and performing a refresh operation on memory cells of a third memory address disposed adjacent to a fourth memory address having the highest count of accesses within the address access table.

9. The method of claim 8, further comprising replacing, within the address access table, a fifth memory address having the lowest count of accesses with a sixth memory address.

10. The method of claim 9, further comprising associating, within the address access table, a count of accesses to the sixth memory address, wherein the count of accesses associated to the sixth memory address is equal to a sum of one and a count of accesses to the fifth memory address.

11. The method of claim 9, wherein the fifth memory address is replaced by the sixth memory address in response to determining that:

the sixth memory address is accessed during a refresh period; and the sixth memory address does not currently exist within the address access table.

12. The method of claim 8, wherein the refresh operation is performed after expiration of a refresh period from a time the address access table is initialized.

13. The method of claim 8, further comprising increasing a count of accesses to a fifth memory address within the address access table by one in response to determining that:

the fifth memory address is accessed within a refresh period from a time the address access table is initialized; and the fifth memory address currently exists within the address access table.

14. The method of claim 8, further comprising adding a fifth memory address to the address access table in response to determining that:

the fifth memory address is accessed within a refresh period from a time the address access table is initialized;

the fifth memory address does not currently exist within the address access table; and the address access table has room to store the fifth memory address without erasing another memory address stored therein.

15. The method of claim 14, further comprising associating a count of accesses having a value of one to the fifth memory address in response to adding the fifth memory address to the address access table.

16. A memory device comprising:

a memory cell array including a plurality of memory cell rows accessed by multiple memory addresses;

a control logic circuit configured to store a count of accesses to each of the multiple memory addresses within an address access table, identify a first count of accesses to a first memory address that is neither the highest nor the lowest count of accesses within the address access table, and swap the first count of accesses with the lowest count of accesses within the address access table, wherein the lowest count of accesses is associated with a second memory address within the address access table; and a refresh control circuit configured to perform a refresh operation on memory cells of a third memory address disposed adjacent to a fourth memory address having the highest count of accesses within the address access table.

17. The memory device of claim 16, wherein the control logic circuit is further configured to replace, within the address access table, a fifth memory address having the lowest count of accesses with a sixth memory address.

18. The memory device of claim 17, wherein the control logic circuit is further configured to set a count of accesses associated with the sixth memory address to a value that is equal to the sum of one and a count of accesses to the fifth memory address.

19. The memory device of claim 17, wherein the fifth memory address is replaced by the sixth memory address in response to determining that:

the sixth memory address is accessed during a refresh period; and the sixth memory address does not currently exist within the address access table.

20. The memory device of claim 16, wherein the refresh operation is performed after expiration of a refresh period from a time the address access table is initialized.

* * * * *